United States Patent [19]

Suyama et al.

[11] Patent Number: 4,940,604

[45] Date of Patent: Jul. 10, 1990

[54] METHOD FOR PRODUCTION OF COPPER INDIUM DISELENIDE

[75] Inventors: Naoki Suyama, Osaka; Noriyuki Ueno, Nara; Kuniyoshi Omura, Osaka; Hazime Takada, Osaka; Yuutaro Kita, Osaka; Mikio Murozono, Osaka, all of Japan

[73] Assignee: Matsushita Electric Industrial Co., Ltd., Osaka, Japan

[21] Appl. No.: 239,742

[22] Filed: Sep. 2, 1988

[30] Foreign Application Priority Data

Sep. 4, 1987 [JP]   Japan ................................. 62-222316

[51] Int. Cl.$^5$ .......................... B05D 5/12; H01L 31/00
[52] U.S. Cl. ......................................... 427/76; 427/74; 136/264; 136/265; 136/256
[58] Field of Search ........................... 427/76, 74, 282; 136/264, 265, 256

[56] References Cited

FOREIGN PATENT DOCUMENTS 63-285974  11/1988  Japan .

OTHER PUBLICATIONS

Kazumi et al., "Preparation of CuInX$_2$(X=S,Se)Films from Mixed Fine Particles of Constituent Elements", Denki Kagaku Oyobi Kogyo Butsuri Kagaku, 57(3), pp. 224–228, (Japan), 1989.

Migliorato et al., J. Appl. Phys., 46 (1975), 1777–1782.

SERI Photovoltaic Advanced Research & Development, An Overview, SERI/SP-281-2235, Feb. 1984.

*Primary Examiner*—Norman Morgenstern
*Assistant Examiner*—Roy V. King
*Attorney, Agent, or Firm*—Wenderoth, Lind & Ponack

[57] ABSTRACT

A polycrystalline CuInSe$_2$ film is produced by adding a liquid cooling medium to a mixture of Cu, In and Se powders, grinding the resulting composition by means of a ball-mill to provide a slurry containing CuInSe$_2$ of low crystallinity, drying and adding a binding agent to the slurry to form a paste, coating a substrate with the paste, and sintering the paste so applied under a nitrogen atmosphere.

The starting materials that can be used are not limited to respective powders of the above-mentioned elements but may be Cu-Se and In-Se compounds and the method provides CuInSe$_2$ of excellent quality on a mass production scale at low cost.

7 Claims, 4 Drawing Sheets

METHOD FOR PRODUCTION OF COPPER INDIUM DISELENIDE

BACKGROUND OF THE INVENTION

1. Field of Technology

This invention relates to a method for producing copper indium diselenide ($CuInSe_2$) which can find application in solar cells and other photovoltaic devices such as photosensors. The object of the invention is to provide an improved production process for $CuInSe_2$ which can be easily carried into practice on a high production basis.

2. Description of the Prior Art

Single-crystal $CuInSe_2$ has heretofore been produced by weighing Cu, In and Se in stoichiometric proportions into a quartz tube, evacuating the quartz tube to about $10^{31\ 6}$ mmHg and, after sealing, heating the tube in an electric furnace at a temperature in the range of 1,050 to 1,100° C. to cause a reaction to proceed in the melt phase (for example, P. Migliorato et al., J. Appl. phys., 46 (1975), 1777–1782.) As the contents of the quartz tube are then cooled gradually, $CuInSe_2$ crystals separate out. $CuInSe_2$ films have been manufactured by vacuum deposition technology such as vacuum vapor deposition, magnetron sputtering or the like using elementary Cu, In and Se (for example, SERI Photovoltaic Advanced Research & Development, An Overview, SERI/SP-281-2236).

However, the $CuInSe_2$ produced by the former method, involving a reaction in melt phase, is expensive and, moreover, the manufacturing process itself has the disadvantage that it does not lend itself well to mass production. The latter method, i.e. vacuum deposition technology, has the disadvantage that it does not yield a sufficiently thick film or a film having a sufficiently large area.

SUMMARY OF THE INVENTION

Having been accomplished to solve the above-mentioned problems, this invention provides a mass production process by which copper indium diselenide can be manufactured in large quantities and at low cost. According to this invention, respective powders of Cu, In and Se are ground together in a liquid cooling medium to give a finely ground powder including $CuInSe_2$ of low crystallinity and, then, sintering the same at a temperature below the melting point of polycrystalline $CuInSe_2$ so as to synthesize $CuInSe_2$.

In accordance with this invention, the energy of said grinding in a liquid cooling medium not only induces a low-temperature synthesis of $CuInSe_2$, though of predominantly low crystallinity, but also comminutes the respective component powders to render them so reactive that they can be sintered together at a temperature below the melting point of polycrystalline $CuInSe_2$. Furthermore, by adding a binding agent to the ground powder mixture thus obtained to give a paste and printing a substrate with the paste, a sintered film of virtually any optional configuration can be manufactured. In addition, by using the screen printing technique, for instance, a $CuInSe_2$ film having an increased area can by easily obtained. Thus, this invention provides copper indium diselenide at low cost on a mass production scale.

DETAILED DESCRIPTION OF THE INVENTION

Preferred embodiments of this invention are described in detail below, with particular reference to $CdS/CuInSe_2$ solar cells fabricated using the copper indium diselenide produced by the method of the invention. In the description, reference is sometimes made to the accompanying drawings for a better understanding of this invention.

EXAMPLE 1

Figure 1:
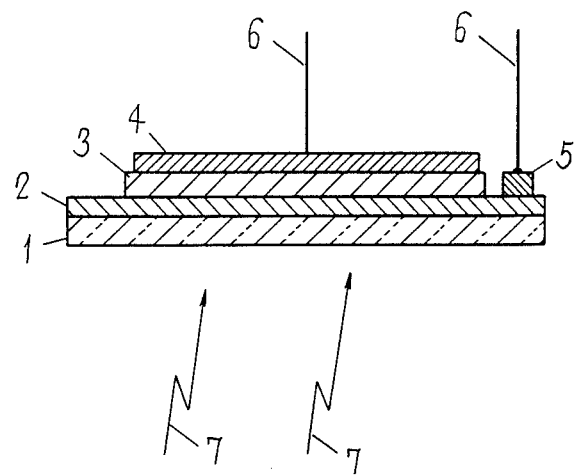
FIG. 1 is a sectional elevation showing a solar cell fabricated using a polycrystalline $CuInSe_2$ manufactured by the method of this invention.

To a CdS powder was added 10 weight percent, based on the weight of said powder, of $CdCl_2$ as a flux and then an appropriate amount of propylene glycol was added as a binding agent. The mixture was kneaded well to give a paste. Using this paste, a glass substrate 1 was printed as illustrated in FIG. 1 and fired at 690° C. in a nitrogen gas atmosphere for 60 minutes, whereby an n-type sintered CdS film 2 was produced. On top of this sintered CdS film 2 was formed a p-type sintered $CuInSe_2$ film 3 by the process described hereinafter. Then, a Mo film 4, intended to serve as an electrode, was deposited on top of said p-type sintered $CuInSe_2$ film 3, while an ohmic electrode 5 was formed on top of the sintered CdS film 2, both by the per se conventional procedure. A lead wire 6 was connected to each of the electrodes. Indicated at 7 are incident light rays.

The sintered $CuInSe_2$ film was formed by the following technique.

Figure 2:
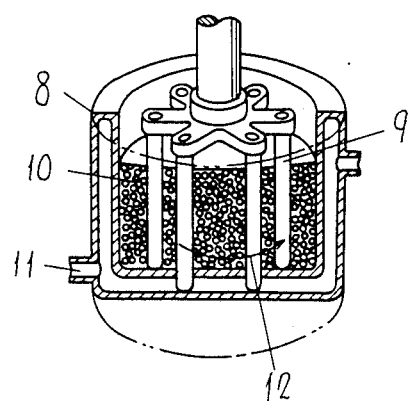
FIG. 2 is a schematic sectional view showing an agitated ball-mill used in the manufacturing method of this invention.
Figure 3:
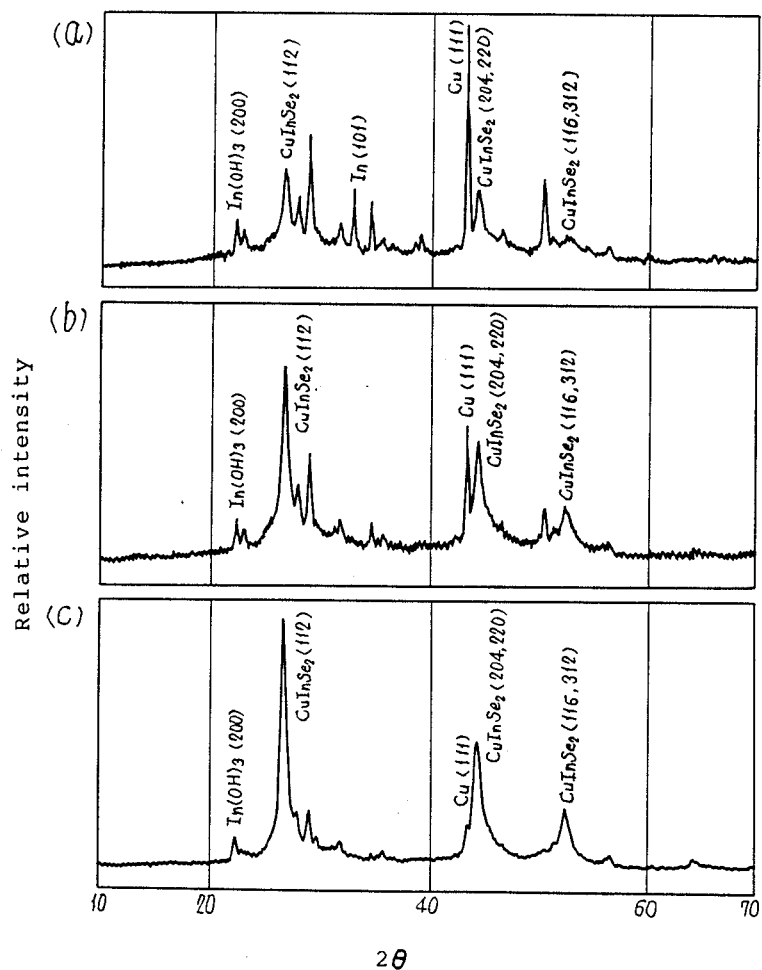
FIG. 3 shows x-ray diffraction patterns of powders ground for (a) 2 hours, (b) 6 hours and (c) 14 hours, respectively.
Figure 4:
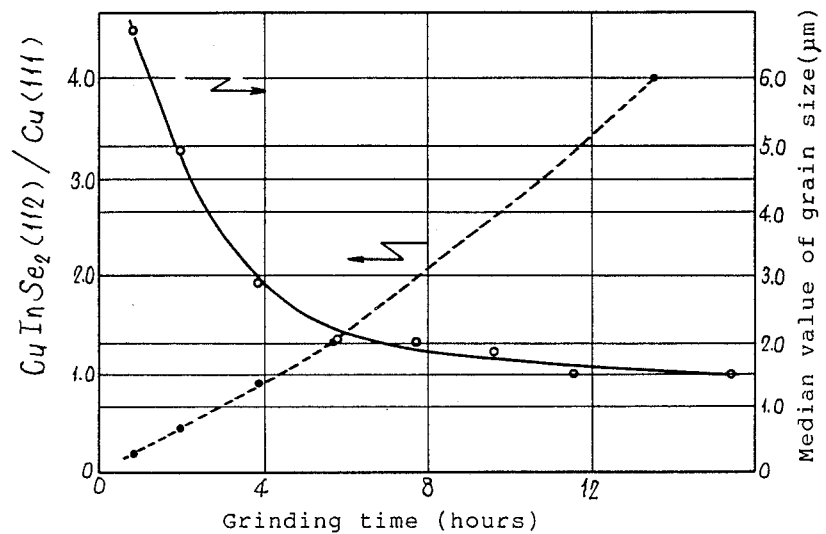
FIG. 4 shows the grinding time-dependence of $CuInSe_2$ synthesis and median value of grain size in Example 1 of this invention.

First, 360 g of Cu powder, 680 g of In powder and 950 g of Se powder, each having a purity not less than 99.99% and having been previously comminuted to a grain size not exceeding 500 μm were provided. To a mixture of these powders was added 3 kg of water or ethylene glycol monophenyl ether and the resulting composition was ground in an agitated ball-mill as illustrated in FIG. 2. Referring to FIG. 2, balls 10 are made of alumina and each measures 5 mm in diameter. The total weight of these balls is 12 kg. The wall of a chamber 8, as well as stirring rods 9, are made of stainless steel. The chamber 8 is provided with a coolant jacket means 11 for a coolant which serves to control the temperature buildup during the grinding operation. It has been found that even when the balls, chamber and stirring rods were made of any zirconia, alumina and silicon carbide, instead of the above-mentioned materials, there occurred no reaction with the powder materials, nor was found any other trouble. The assembly of stirring rods 9 is driven by an external drive source in the counterclockwise direction indicated by arrowmark 12 in FIG. 2. FIG. 3 shows the x-ray diffraction patterns of powders ground for (a) 1 hour, (b) 6 hours and (c) 14 hours. It is clear that with the progress of grinding time, the peaks of Cu and In elements were diminished, while the peak of $CuInSe_2$ increased. Taking the diffraction intensity ratio of the (112) plane of $CuInSe_2$ to the (111) plane of Cu as the degree of $CuInSe_2$ synthesis, the dependency of $CuInSe_2$ synthesis on grinding time was investigated. The results are shown in FIG. 4. It is apparent that the degree of $CuInSe_2$ synthesis increases substantially in proportion with grinding time. On the other hand, the relationship between the median value of grain size of ground powder and the grinding time is indicated by a solid line in FIG. 4.

It is seen that whereas the comminution of powder progresses rapidly during an initial phase of 6 hours, it then tends to reach a saturation point of about 1.5 $\mu$m. Based on the above results, a ground powder having degree of $CuInSe_2$ synthesis in the neighborhood of 0.8 and a median grain size of 2.0 $\mu$m was prepared by carrying out the grinding for 3.5 hours.

Figure 5:
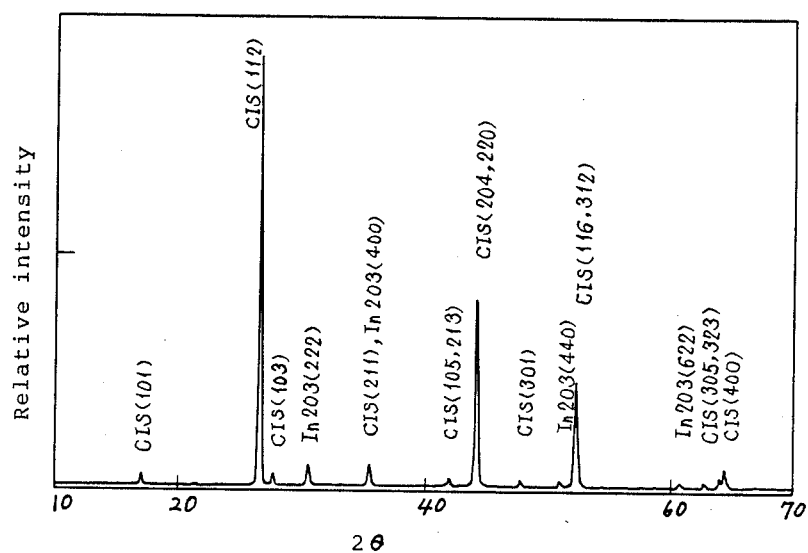
FIG. 5 is an x-ray diffraction pattern of the sintered film fabricated in Example 1.

To the resulting ground powder including $CuInSe_2$ of low crystallinity was added a suitable amount of propylene glycol as a binding agent and the resulting paste was printed on the aforementioned n-type sintered CdS film 2 and dried at 120° C. for 60 minutes. The dried film was then sintered in a $N_2$ atmosphere at 650° C. for 60 minutes to give a sintered $CuInSe_2$ film 3. The x-ray diffraction pattern of the resulting sintered $CuInSe_2$ film is shown in FIG. 5. Table 1 shows these x-ray diffraction data in comparison with the JCPDS (Joint Committee on Powder Diffraction Standards) card. The presence of diffraction peaks corresponding to the (101), (103), (211), (213), (105) and (301) planes indicates that this $CuInSe_2$ film is of the chalcopyrrhotite structure. Furthermore, based on the agreement in values of d, the sintered $CuInSe_2$ film was found to contain $In_2O_3$. This impurity was probably attributable to the grinding in water and it can be seen from Table 1 that the formation of $In_2O_3$ is significantly inhibited by performing the grinding operation in ethylene glycol monophenyl ether.

lead wire 6 was connected to each of the electrodes 4 and 5. In this manner, a heterojunction solar cell having a photovoltaic function between the n-type sintered CdS film and the p-type sintered $CuInSe_2$ film was fabricated. The radiation 7 was incident on the sintered CdS film 2 side.

Table 2 shows the relationship between the compounding ratio of material Cu, In and Se powders and the conversion efficiency of a $CdS/CuInSe_2$ solar cell fabricated using the materials. A solar cell having the highest conversion efficiency could be obtained when the compounding ratio of Cu, In and Se was 24:25:51. When the Cu content was increased, reflections due to Cu element were detected in the x-ray diffraction pattern of the sintered film.

TABLE 2

| Compounding ratio (mole %) | | | Conversion |
|---|---|---|---|
| Cu | In | Se | efficiency (%) |
| 20 | 20 | 60 | 4.6 |
| 20 | 30 | 50 | 5.0 |
| 24 | 20 | 56 | 4.1 |
| 24 | 25 | 51 | 5.7 |
| 28 | 20 | 52 | 2.5 |
| 28 | 25 | 47 | 3.0 |

When the degree of $CuInSe_2$ synthesis relative to the Cu content after grinding was less than 0.1, an acceptable sintered film could not be obtained at any temperature below 700° C.

When the degree of $CuInSe_2$ synthesis exceeded 1.5, sintering produced $CuInSe_2$ but caused a drastic decrease in adhesion to the underlying CdS film.

Furthermore, when the diameter of balls used in grinding was either smaller than 1.0 mm or larger than 10.0 mm, or when the ratio of the total weight of material Cu, In and Se powders to the total weight of the balls was either less than 0.05 or more than 0.5, the degree of $CuInSe_2$ synthesis became lower than 0.1 or higher than 1.5 or the median grain size of ground powder became smaller than 1.0 or larger than 5.0 $\mu$m. As a

TABLE 1

| Grinding in water | | Grinding in ethylene glycol monophenyl ether | | JCPDS card | | | | | |
|---|---|---|---|---|---|---|---|---|---|
| | | | | 23-209 $CuInSe_2$ | | | 6-0416 $In_2O_3$ | | |
| d | I/Io | d | I/Io | d | I/Io | hkl | d | I/Io | hkl |
| 5.193 | 4 | 5.211 | 3 | 5.20 | 6 | 101 | | | |
| 4.137 | 2 | | | | | | 4.13 | 14 | 211 |
| 3.351 | 100 | 3.356 | 100 | 5.34 | 70 | 112 | | | |
| 3.225 | 4 | 3.232 | 3 | 3.20 | 6 | 103 | | | |
| 2.925 | 6 | 2.903 | 1 | | | | 2.921 | 100 | 222 |
| 2.528 | 7 | 2.532 | 4 | 2.52 | 15 | 211 | 2.529 | 30 | 400 |
| 2.153 | 3 | 2.157 | 2 | 2.15 | 6 | 105,213 | | | |
| 2.051 | 45 | 2.053 | 48 | 2.04 | 100 | 204,220 | | | |
| 1.982 | 2 | | | | | | 1.984 | 10 | 431 |
| 1.904 | 3 | 1.907 | 2 | 1.900 | 6 | 301 | | | |
| 1.789 | 3 | | | | | | 1.788 | 35 | 440 |
| 1.747 | 26 | 1.748 | 26 | 1.743 | 85 | 116,312 | | | |
| 1.526 | 2 | | | | | | 1.525 | 25 | 622 |
| 1.484 | 2 | 1.484 | 2 | 1.480 | 6 | 305,323 | | | |
| 1.447 | 6 | 1.448 | 5 | 1.446 | 25 | 400 | | | |
| 1.398 | 2 | | | | | | 1.403 | 2 | 640 |
| 1.394 | 2 | 1.395 | 1 | 1.393 | 4 | 217,411 | | | |

More or less similar results were obtained when perfluorobutyltetrahydrofuran or propylene glycol was used in lieu of ethylene glycol monophenyl ether.

Then, using a DC magnetron sputter, a Mo film 4 was formed on the sintered $CuInSe_2$ film as an electrode on the $CuInSe_2$ film 3. Thereafter, an ohmic electrode 5 was provided on top of the sintered CdS film 2 and a result, the paste prepared from such ground powder was extremely poor in printability and the conversion efficiency of the solar cell fabricated therefrom was extremely low.

EXAMPLE 2

In the same manner as Example 1, an n-type sintered CdS film 2 was first formed as illustrated in FIG. 1. Then, $Cu_2Se$ and $In_2Se_3$ powders, each having a purity not less than 99.99% and having been preliminarily comminuted to a grain size not exceeding 500 $\mu$m, were taken in a mole ratio of 1:1. To a mixture of these powders was added the same weight of water and the whole composition was ground in an agitated ball-mill as illustrated in FIG. 2. Quantitative x-ray diffraction analysis of the ground powder revealed that the total proportion of polycrystalline $CuInSe_2$ and $CuInSe_2$ of low crystallinity was about 50% by weight. The median grain size of this powder was 2.0 $\mu$m. To this ground powder including polycrystalline $CuInSe_2$ and $CuInSe_2$ of low crystallinity was added propylene glycol, a binding agent, to prepare a paste. This paste was printed on the aforementioned n-type sintered CdS film 2, dried and sintered in a nitrogen atmosphere at 600° C. for 60 minutes, whereby a sintered $CuInSe_2$ film 3 was provided. The formation of the sintered $CuInSe_2$ film 3 was confirmed by x-ray diffraction analysis. Then, using a DC magnetron sputter, a 1.5 $\mu$m-thick Mo film was formed on top of the sintered $CuInSe_2$ film 3 to serve as an electrode on the $CuInSe_2$ side. Then, an ohmic electrode 5 was provided on top of the sintered CdS film 2, and a lead wire 6 was connected to each of the electrodes 4 and 5. In this manner, a heterojunction solar cell having a photovoltaic effect between the n-type sintered CdS film 2 and the p-type sintered $CuInSe_2$ film 3 was provided. The radiation 7 was incident on the sintered CdS film side. The conversion efficiency at AM 1.5, 100 $mW/cm^2$ was 6.0%.

When the proportion of $CuInSe_2$ after grinding was less than 10% by weight, the sintered film was extremely fragile due to insufficient intergrain binding. On the other hand, when said proportion was in excess of 70% by weight, a sintered film could not be obtained at a temperature below 600° C. Similar changes were observed when the grain size of ground powder was less than 0.5 $\mu$m, while the paste was poor in printability when the grain size exceeded 5 $\mu$m.

On the other hand, the equivalent conversion efficiency was obtained when CuSe and InSe, instead of the corresponding elements, were used in a mole ratio of 1:1 and processed in the same manner as above to provide a $CuInSe_2$ film. Thus, copper indium diselenide could be mass produced at low cost by the above-described steps of grinding a mixture of Cu, In and Se powders or Cu-Se and In-Se compounds in a liquid cooling medium to give a finely ground powder including $CuInSe_2$ of low crystallinity, preparing a paste thereof, coating a substrate with the paste, and sintering the coat at a temperature below the melting point of $CuInSe_2$.

What is claimed is:

1. A method of producing a copper indium diselenide film which comprises adding a liquid cooling medium to a mixture of Cu, In and Se powders, said liquid cooling medium being selected from the group consisting of water, ethylene glycol monophenyl ether, propylene glycol and perfluorobutyltetrahydrofuran, grinding the resulting mixture using a mill to give a slurry containing a ground powder including $CuInSe_2$ of low crystallinity, drying and adding a binding agent to said slurry to give a paste, wherein said binding agent is propylene glycol, coating a substrate with said paste, and sintering the paste so applied under a nitrogen atmosphere to form a polycrystalline $CuInSe_2$ film.

2. The method of claim 1, wherein the ratio of said Cu, In and Se powders is 24:25:51.

3. The method of claim 1, wherein said mill is an agitated ball-mill.

4. The method of claim 1, wherein each of said material Cu, In and Se powders has a grain size not exceeding 500 $\mu$m.

5. The method of claim 1, wherein the ground powder prior to sintering has a median grain size of 1.5 to 5.0 $\mu$m.

6. The method of claim 1, wherein the coating of said substrate with said paste containing $CuInSe_2$ of low crystallinity is carried out by a screen printing or writing machine.

7. The method of claim 1, wherein the sintering is performed at a temperature below the melting point of polycrystalline $CuInSe_2$.

* * * * *